United States Patent [19]
Cho et al.

[11] Patent Number: 5,155,406
[45] Date of Patent: Oct. 13, 1992

[54] MULTIPLE NEAREST NEIGHBOR FILTER BANK

[75] Inventors: Frederick Y. Cho, Scottsdale, Ariz.; Donald C. Malocha, Longwood, Fla.; Frederick M. Fliegel, Phoenix, Ariz.

[73] Assignee: Motorola, Inc., Schaumburg, Ill.

[21] Appl. No.: 681,474

[22] Filed: Apr. 4, 1991

Related U.S. Application Data

[63] Continuation of Ser. No. 473,564, Feb. 1, 1990, abandoned.

[51] Int. Cl.$^5$ .............................................. H01L 41/08
[52] U.S. Cl. ........................ 310/313 B; 310/313 C; 310/313 D; 333/154; 333/193
[58] Field of Search .......... 310/313 B, 313 C, 313 D; 333/154, 193

[56] References Cited

U.S. PATENT DOCUMENTS

| | | | |
|---|---|---|---|
| 3,962,673 | 7/1976 | Desbois et al. | 310/313 B |
| 3,991,330 | 11/1976 | Isaacs et al. | 310/313 B |
| 4,389,590 | 6/1983 | Whitlock | 310/313 R |
| 4,516,093 | 5/1985 | Nyffeler | 333/193 |
| 4,602,228 | 7/1986 | Yamada | 310/313 D |
| 4,612,274 | 9/1986 | Cho | 430/296 |
| 4,884,001 | 11/1989 | Sacks et al. | 310/313 A |
| 4,893,161 | 1/1990 | Tanski et al. | 357/24 |
| 4,926,083 | 5/1990 | Merritt et al. | 310/313 R |
| 4,990,814 | 2/1991 | Tanski et al. | 310/313 R |
| 4,994,772 | 2/1991 | Ballato | 333/152 |
| 5,034,793 | 7/1991 | Malocha et al. | 333/154 |

OTHER PUBLICATIONS

W. Tanski et al. "Heterostructure Acoustic Charge Transport Devices on MBE Grown GaAs/(Al,Ga)As Epitaxial Layers", no date, p. 1, FIGS. 1 and 2.
R. Sacks et al. "Acoustic charge transport in an (Al,-Ga)As/GaAs heterojunction structure grown by molecular beam epitaxy" Sep. 1987, pp. 1-3, all Figures.
"Channelizers, Programmable Filters, Frequency Excisors", Act Ap. Note #106—published by Electronic Filters Incorporated in 1989, see introductory page and FIG. 1 on that page.
Miller et al. "An Acoustic Charge Transport Digitally Programmable Transversal Filter", Dec. 1989, pp. 1-4.
"A CCD-Programmable SAW Matched Filter" by D. L. Smyth et al, 1979 Ultrasonics Symposium, IEEE (Sep. 26-28, 1979).

Primary Examiner—Mark O. Budd
Assistant Examiner—Thomas M. Dougherty
Attorney, Agent, or Firm—Frederick M. Fliegel; Frank J. Bogacz

[57] ABSTRACT

An ACT (acoustic charge transport) filter comprises a plurality of SAW (surface acoustic wave) transducers and an interleaved filter bank coupled on either transversal side of the SAW transducer. Each interleaved filter bank comprises two filters, and the electrodes of the two filters are interleaved. Isolation between the interleaved electrodes is supplied by a meadering ground. The electrodes are apodized to facilitate weighted sampling of the delayed signal. Multiple frequency characteristics may be extracted from a single ACT filter by cascading the SAW transducer/interleaved filter bank combinations. Weighted sampling of the delayed signal may also be accomplished through weighted withdrawal of the ACT filter.

10 Claims, 1 Drawing Sheet

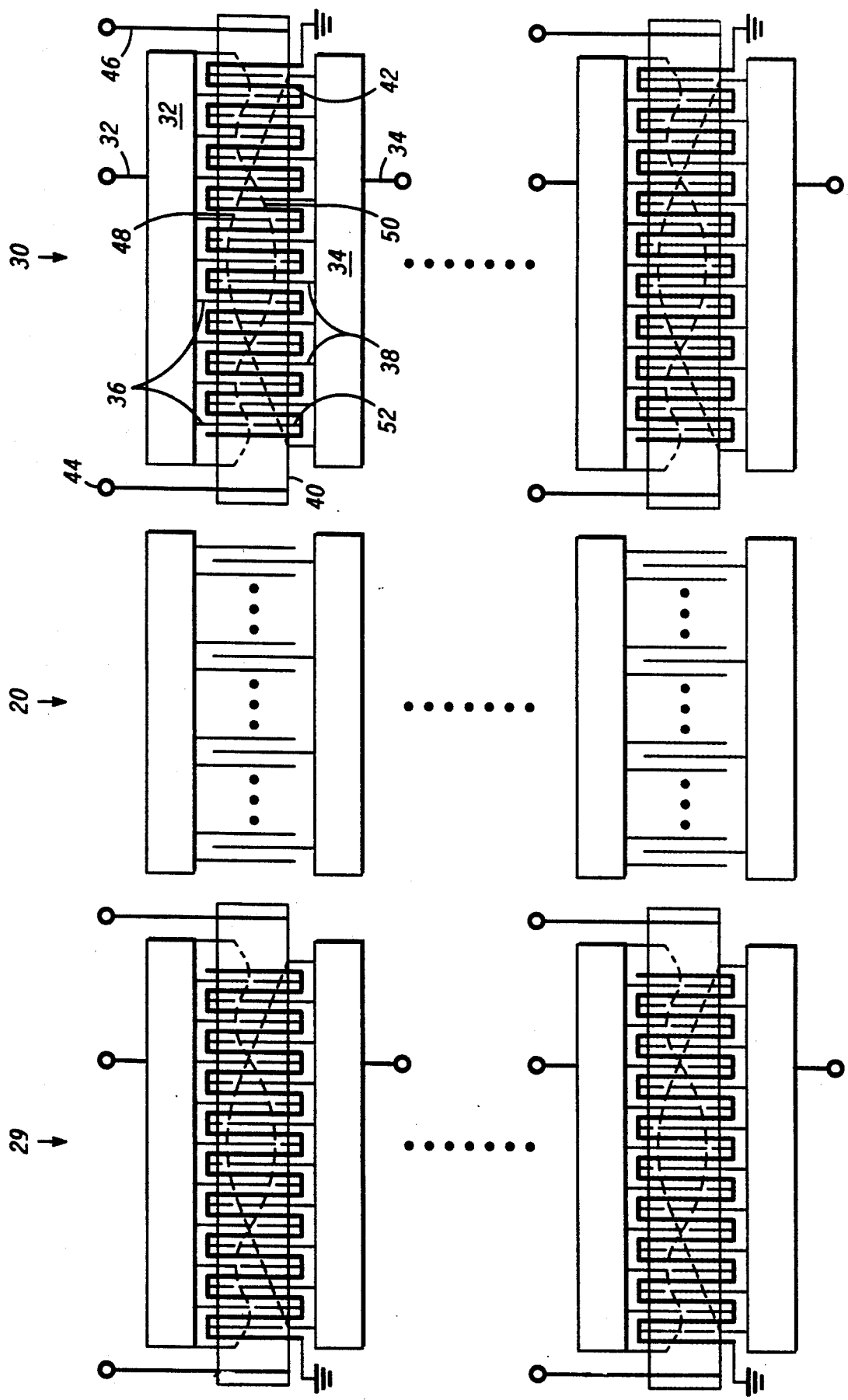

MULTIPLE NEAREST NEIGHBOR FILTER BANK

This application is a continuation of prior application Ser. No. 473,564, filed Feb. 1, 1990, now abandoned.

BACKGROUND OF THE INVENTION

This invention relates, in general, to surface acoustic wave (SAW) devices, and more specifically, to acoustic charge transport (ACT) devices.

ACT is a relatively new technology relating to SAW devices. ACTs can perform many functions such as delay and transversal filtering, and are formed on Galium Arsenide (GaAs) substrates to take advantage of the high processing speed of GaAs. The ACT devices may be used in radios employing SAW filters, amplifiers which compensate for SAW filter insertion loss, and MMIC switches for changing filters.

As explained in U.S. Pat. No. 4,633,285, issued Dec. 30, 1986 to Billy Jo Hunsinger and assigned to University of Illinois, an ACT comprises a buried channel formed by placing a piezoelectric semiconductor material between confining layers of GaAs. A SAW is then generated within the piezoelectric layer. As the SAW propagates through the piezoelectric layer, an input signal is injected into the wells of the SAW from which majority carriers have been depleted. The signal is carried by the SAW below electrodes which are capacitively coupled to the piezoelectric layer. The electrodes can extract the magnitude of the charge in each SAW well without actually extracting charge from the signal. This process is termed non-destructive sensing since the capacitively extracted charge magnitude does not deplete the charge in the SAW well.

A specific use of ACT filters is digitally programmable transversal filters, or DPTF. One such DPTF is described in AN ACOUSTIC CHARGE TRANSPORT DIGITALLY PROGRAMMABLE TRANSVERSAL FILTER, by R. Miller, C. Ricci, and R. Kansy, *IEEE JOURNAL OF SOLID-STATE CIRCUITS*, Vol. 24, No. 6, December 1989. The taps of the ACT described within this article are each programmable to give a variable weighting for the combinations of taps. Significant relative space is required on the GaAs structure to support the circuitry necessary to separately program each tap. Furthermore, programming of the individual taps for each new input signal requires valuable time.

SUMMARY OF THE INVENTION

It is therefore an object of the present invention to provide an ACT SAW filter, having a reduced size, which is capable of tapping varied weighted delay signals from a propagating SAW signal in substantially reduced time.

An ACT filter comprises a plurality of SAW transducers and an interleaved filter bank coupled on either transversal side of each of the SAW transducers. Each interleaved filter bank comprises two filters, and the electrodes of the two filters are interleaved. Isolation between the interleaved electrodes is supplied by a meandering electronic/electrical ground. The electrodes are apodized to facilitate weighted sampling of the delayed signal. Multiple frequency characteristics may be extracted from a single ACT filter. Weighted sampling of the delayed signal may also be accomplished through weighted withdrawal of the ACT filter.

The above and other objects, features, and advantages of the present invention will be better understood from the following detailed description taken in conjunction with the accompanying drawings.

BRIEF DESCRIPTION OF THE DRAWING

The FIGURE is a schematic of an ACT SAW programmable transverse filter device according to the present invention.

DETAILED DESCRIPTION OF THE INVENTION

Acoustic charge transport (ACT) filters are surface acoustic wave (SAW) devices which include non-destructive charge sensing abilities. An ACT comprises a buried channel formed by placing a piezoelectric semiconductor material between confining layers of GaAs (gallium arsenide). A SAW is then generated within the piezoelectric layer. An input signal is disposed within wells of the SAW as it propagates through the GaAs structure. As the SAW passes underneath electrodes on the surface of the GaAs structure, electrical charge within each of the wells which represent the input signal are capacitively measured. None of the electric charge is removed. The charge in each well may be sampled by many electrodes as the SAW wave continues to propagate throughout the GaAs structure. The SAW wave propagates throughout the GaAs structure very slowly compared to electrical waves propagating through GaAs. The slow speed of the propagation facilitates accurate delayed sampling. As the SAW wave passes under each electrode, a new delayed sample of the signal is obtained. This provides a filtering function known as transversal filtering which is often used in communication applications to discriminate between different frequencies. A basic description of the ACT process is described in U.S. Pat. No. 4,633,285, issued Dec. 30, 1986 to Billy Jo Hunsinger, et al., and assigned to the University of Illinois.

The accompanying figure represents an ACT (acoustic charge transport) SAW (surface acoustic wave) device 10 (hereafter ACT 10) which allows filtering of various frequencies with low power requirements.

ACT 10 comprises SAW transducer 20 and interleaved filter banks 29 and 30. As indicated in the figure, SAW transducer 20 and interleaved filter banks 29 and 30 are replicated numerous times. All of the replications are constructed on a single gallium arsenide (GaAs) chip. The number of replications are dependent upon the number of combinations of frequencies, or frequency characteristics, which may be extracted from an input signal, or series of input signals. For example, a radio utilizing the ACT 10 and having different operating frequencies would have a corresponding number of SAW transducer 20/interleaved filters 29 and 30 combinations.

Although filter banks 29 and 30 are shown in the Figure as having the same structure, in practice, each interleaved filter will vary in structure depending upon the frequency characteristics desired.

Interleaved filter bank 30 comprises bus bars 32 and 34, electrodes 36 which are coupled to bus bar 32, electrodes 38 which are coupled to bus bar 34, semiconductor channel 40, and meandering ground 42. An input 44 supplies electric input signals to semiconductor channel 40, and an output 46 removes the signal from semiconductor channel 40.

Bus bars 32 and 34 provide filtered outputs of input 44 at the respective terminals indicated. Outputs 32 and 34 comprise non-destructive sensing outputs. The outputs of bus bars 32 and 34 are located intermediate to output 46 and input 44. Output 46 is a destructive sensing output which indicates that output 46 destroys the input signal.

By interleaving electrodes 38 and 36 within a single channel 40, two separate frequencies may be sampled from a single input signal from input 44. By coupling two interleaved filter banks, filter banks which include a plurality of semiconductor channels 29 and 30, to SAW transducer 20, four frequencies can be sampled from the power required to activate one SAW transducer.

Meandering ground 42 decouples interleaving electrodes 38 and 36 from each other. Meandering ground 42 further operates to provide ground return from bus bars 32 and 34. As seen in the Figure, meandering ground incorporates dummy electrodes 52. Dummy electrodes 52 minimize distortion in the sampled signal, and maintain uniformity of charge.

An inspection of electrodes 38 and 36 of interleaved filter bank 30 shows that the respective electrodes are of varying length. The patterns of the electrodes are shown by the dashed lines numbered 48 and 50. As lines 48 and 50 indicate, the varying shapes of electrodes 36 are different from the shapes of electrodes 38. The different shapes allows the two separate filters of interleaved filter bank 30 to sample two separate frequency characteristics. If the shape of dashed lines 48 and 50 were the same, the sampled frequency characteristics would be identical. Each interleaved filter throughout the entire ACT having a different shape of electrodes will sample a different frequency characteristic.

As a SAW wave propagates through semiconductor channel 40, it is sampled by the varying lengths of the electrodes. The amplitude of the sample is dependent upon the length of the respective electrode. For a single filter, such as the filter represented by bus bar 32 and electrodes 36, the input signal will be sampled at many delayed and different amplitudes. The weighted samples are then summed at bus bar 32 and generate an accurate description of the frequency characterization. Utilization of varying lengths of electrodes is termed apodization.

Another method of weighting the filter function of a specific filter is through withdrawal weighting. Through withdrawal weighting, several of the electrodes are effectively removed such that no sample is taken by the selected electrodes. A sample having an amplitude equal to the total sum of the amplitudes of the selected electrodes is taken by a single electrode.

In its preferred embodiment, ACT 10 incorporates many interleaved filter bank/SAW transducer combinations on a single monolithic unit. Each filter of each interleaved filter bank may be constructed to define a different frequency characteristic. When a specific frequency characteristic is desired, the SAW transducer 20 associated with that particular interleaved filter bank is activated, and the frequency characteristic from the filter designed to define that characteristic is tapped. Separate programming of the individual electrodes, which would otherwise require additional processing time, is eliminated.

It will be recognized that utilizing a single SAW transducer to operate four filters presents substantial savings in power. The small size of the repeating interleaved filter banks allows ACT 10 to be incorporated in MMIC (monolithic microwave integrated circuit) devices. Filters which program each individual electrode, known as digitally programmable transversal filters, or DPTF, require large supporting circuitry which is not compatible with MMIC devices. The large supporting circuits also require substantial power.

By interleaving filters in ACT 10, filter functions can be changed rapidly compared with DPTF systems. Furthermore, interleaving allows the same charge within each well of the SAW wave to be sampled multiple times, thus reducing power requirements. An additional benefit of interleaving the electrodes to form interleaved filter banks is that the filters within the interleaved filter banks will have the same group delay. This is often an important system requirement where simultaneous reception of multiple channels is required for synchronization, communication target acquisition, or signal processing.

ACT 10 has been described throughout this description as operating on an acoustic charge transport device as described by the previously referenced U.S. Pat. No. 4,633,285. ACT 10 is not limited to use on such a substrate, but can be further utilized in heterojunction acoustic charge transport devices, or HACT's. HACT devices have other semiconducting layers, such as aluminum gallium arsenide AlGaAs layers, intermixed with GaAs layers. Some articles explaining basics of HACT technology include A 3.35 MICROSECOND HACT TRANSVERSAL FILTER, by Merritt, Tanski, Cullen, Sacks, Carroll, and Branciforte, 1989 IEEE Ultrasonics Symposium, Oct. 3–6, 1989; and HETEROJUNCTION ACOUSTIC CHARGE TRANSPORT DEVICES ON GAAS, by Tanski, Merritt, Sacks, Cullen, Brancifort, Carroll, and Eschrich, Appl. Phys. Lett. 52(1), Jan. 4, 1988, ppg. 18–20.

Thus there has been provided, in accordance with the present invention, an ACT SAW filter that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. An acoustic charge transport (ACT) device comprising:
   SAW (surface acoustic wave) transducer means for generating a SAW wave;
   a semiconductor channel, said semiconductor channel coupled to said SAW transducer means to allow said SAW wave to propagate through said semiconductor channel;
   input means coupled to said semiconductor channel to imbed an electric charge representing an input signal within said propagating SAW wave;
   first output means coupled to said semiconductor channel for providing a delayed replica of said input signal;
   second output means coupled to said semiconductor channel for providing a first output signal in a first frequency range of said input signal;
   third output means coupled to said semiconductor channel for providing a second output signal in a second frequency range of said input signal;

said second output means includes a first plurality of electrodes coupled to a first bus bar;

said third output means includes a second plurality of electrodes coupled to a second bus bar; and said first and second sets of a plurality of electrodes interleaved between each other along said semiconductor channel.

2. An ACT device according to claim 1, wherein said first and second pluralities of electrodes are apodized to weight sampling of said electric charge.

3. An ACT device according to claim 1, wherein said first and second pluralities of electrodes are withdrawal weighted to weight sampling of said electric charge.

4. An ACT device according to claim 1, wherein said semiconductor channel comprises:

a meandering ground; and said meandering ground isolating said first and second pluralities of electrodes.

5. An ACT device according to claim 1, wherein said first plurality of electrodes is withdrawal weighted, and said second plurality of electrodes is apodized.

6. An ACT device according to claim 1, wherein said SAW transducer means, said semiconductor channel, and said first, second, and third output means coupled on a material comprising aluminum gallium arsenide layers intermixed with gallium arsenide layers.

7. An ACT device according to claim 1, wherein said SAW transducer means, said semiconductor channel, and said first, second, and third output means coupled on a homogeneous material comprising layers of gallium arsenide with piezoelectric semiconductor material.

8. An ACT device according to claim 1, wherein said first output means includes destructive sensing means for sensing and destroying said input signal.

9. An ACT device according to claim 8, wherein said second and third output means include non-destructive sensing means for sensing and allowing propagation of said input signal along said semiconductor channel, said second and third output means positioned intermediate to said input means and to said first output means.

10. A multi-directional acoustic charge transport (ACT) device comprising:

SAW (surface acoustic wave) transducer means for generating bidirectional SAW waves;

a plurality of semiconductor channels, each said semiconductor channel coupled to said SAW transducer means to allow said SAW wave to propagate through each semiconductor channel;

first and second input means coupled respectively to one of said semiconductor channels to imbed first and second electric charge representing first and second input signals within a corresponding one of said semiconductor channels;

a plurality of first output means, each coupled to a corresponding semiconductor channel for providing a delayed replica of said corresponding input signal;

a plurality of second output means each coupled to a corresponding semiconductor channel, each said second output means for providing a first output signal in a first frequency range of said corresponding input signal; and a plurality of third output means each coupled to a corresponding semiconductor channel, each said third output means for providing a second output signal in a second frequency range of said corresponding input signal.

* * * * *